United States Patent
Nam

(10) Patent No.: US 7,952,133 B2
(45) Date of Patent: May 31, 2011

(54) FLASH MEMORY AND METHOD FOR MANUFACTURING THE SAME

(75) Inventor: Sang Woo Nam, Cheongju-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 215 days.

(21) Appl. No.: 12/270,803

(22) Filed: Nov. 13, 2008

(65) Prior Publication Data
US 2009/0072293 A1 Mar. 19, 2009

Related U.S. Application Data

(62) Division of application No. 11/595,522, filed on Nov. 9, 2006, now Pat. No. 7,465,629.

(30) Foreign Application Priority Data

Nov. 9, 2005 (KR) .......................... 10-2005-0106813

(51) Int. Cl.
*H01L 29/788* (2006.01)
(52) U.S. Cl. ................................ 257/316; 257/E27.086
(58) Field of Classification Search .......... 257/316–321, 257/E27.086
See application file for complete search history.

(56) References Cited

U.S. PATENT DOCUMENTS

| | | | |
|---|---|---|---|
| 4,597,159 A | 7/1986 | Usami et al. | |
| 5,731,239 A | 3/1998 | Wong et al. | |
| 5,776,835 A | 7/1998 | Yeh et al. | |
| 6,004,849 A | 12/1999 | Gardner et al. | |
| 6,211,012 B1 | 4/2001 | Lee et al. | |
| 6,268,624 B1 | 7/2001 | Sobek et al. | |
| 6,534,818 B2 | 3/2003 | Hsu | |
| 6,706,594 B2 | 3/2004 | Hurley | |
| 6,790,729 B1 * | 9/2004 | Woo | 438/257 |

FOREIGN PATENT DOCUMENTS

| | | |
|---|---|---|
| KR | 2002-0055881 | 7/2002 |
| KR | 2002-0056141 | 7/2002 |

OTHER PUBLICATIONS

Seung Uk Choi, Bong Gil Kim, Gi Jun Kim, and Gi Seok Kim; "Method for Fabricating Flash Memory Device"; Korean Patent Abstracts; Publication No. 1020020055881 A; Published on Jul. 10, 2002; Korean Intellectual Property Office, Republic of Korea.

Bong Gil Kim, Gi Jun Kim, Geun U Lee, Seong Gi Park; "Method of Fabricating Semiconductor Devices"; Korean Patent Abstracts; Publication No. 1020020056141 A; Published on Jul. 10, 2002; Korean Intellectual Property Office, Republic of Korea.

Korean Office Action dated Nov. 24, 2006; Korean Patent Application No. 10-2005-0106813; 2 Pgs.; Korean Intellectual Property Office, Republic of Korea.

* cited by examiner

*Primary Examiner* — Richard A. Booth
(74) *Attorney, Agent, or Firm* — The Law Offices of Andrew D. Fortney; Andrew D. Fortney; Anthony R. Jimenez

(57) ABSTRACT

Provided are a flash memory and a method for manufacturing the same. The flash memory includes a semiconductor substrate having a device isolation region and an active region; a stacked gate on the semiconductor substrate; an insulation layer covering the semiconductor substrate and the stacked gate; a drain contact penetrating the insulation layer on one side of the stacked gate; and a source line penetrating the insulation layer on an opposite side of the stacked gate.

20 Claims, 5 Drawing Sheets

FLASH MEMORY AND METHOD FOR MANUFACTURING THE SAME

The present application is a divisional of U.S. patent application Ser. No. 11/595,522, filed Nov. 9, 2006, now U.S. Pat. No. 7,465,269.

BACKGROUND OF THE INVENTION

1. Field of the Invention

The present invention relates to a flash memory and a method for manufacturing the same.

2. Description of the Related Art

A semiconductor memory may be classified as a volatile memory or a non-volatile memory. In an aspect of process technology, a non-volatile memory device may be classified as a floating gate memory device or a metal insulator semiconductor (MIS) memory device having more than two dielectric layers that are doubly or triply stacked.

The floating gate memory device embodies a memory character by using a potential well, and includes an erasable programmable read only memory (EPROM) tunnel oxide (ETOX) in a simple stacked structure that is widely used in an electrically erasable programmable read only memory (EEPROM), and/or a split gate structure that includes two transistors in one cell.

On the other hand, the MIS memory device performs memory functions by using a charge trapping layer that may occur in a dielectric layer bulk, a dielectric layer-dielectric layer interface, and/or a dielectric layer-semiconductor interface. An example of such a MIS memory is a metal/silicon oxide-nitride-oxide (ONO) semiconductor (MONOS/SONOS) structure that is widely applied to a flash EEPROM.

A related art flash memory unit cell is described with reference to FIG. 1.

A gate oxide layer 12 is formed on a semiconductor substrate 10 having a device isolation layer 11. A first poly silicon layer is formed on the gate oxide layer 12 to be used as a floating gate 13. A dielectric layer 15 and a second poly silicon layer are formed on the floating gate 13. The second poly silicon layer is used as a control gate 16. The dielectric layer 15 may include an ONO layer. A metal layer 17 and a nitride layer 18 are formed on the top of the control gate 16, and are then patterned in a cell structure to form a flash memory cell 90.

The flash memory device includes a source connection layer connecting sources in each unit cell to form a source line. In a recent flash memory device, the source connection layer mainly uses a source line comprising an impurity diffusion layer to achieve a high degree of integration by a self aligned source (SAS) process.

Hereinafter, a flash memory 100 made using a SAS process is described with reference to FIGS. 2 to 5.

FIG. 2 is a plan view of the related art flash memory 100.

Here, a reference number 50 is a gate extending along a word line WL direction on the semiconductor substrate. A reference number 11 represents a device isolation region formed by a shallow trench isolation (STI) process. At this point, a dotted line is a boundary of an inclined plane in a sidewall of the trench isolation. A reference number 20 is a source line doped with an impurity in a memory cell made by a SAS process.

In the SAS process, after opening a source region of a cell using an additional SAS mask when a gate electrode in a stacked structure is formed, an anisotropic etching process is performed to remove a device isolation region 11 (generally, a field oxide layer) where a source line will be formed for a common source line in adjacent cells.

The source line of the flash memory using a SAS process will described in more detail with reference to FIGS. 3 to 5.

FIG. 3 is sectional view taken along line A-A' in an active region of a semiconductor substrate of FIG. 2. Two stacked gates 50 and a common source line 20 will be mainly described for convenience.

A first stacked gate 50 includes a gate oxide layer 12 on a semiconductor substrate 10, a floating gate 13 on the gate oxide layer 12, an ONO dielectric layer 15 on the floating gate 13, and a control gate 16. A second stacked gate 50 has a structure identical to that of the first stacked gate 50. A source line 20 is formed between the first stacked gate 50 and the second stacked gate 50.

A method for manufacturing the source line 20 by using a related art SAS process includes etching an oxide layer, i.e., a device isolation layer 11 (see FIG. 4) in a field region after forming the stacked gate 50, and performing an ion implantation process to form a low resistance source line 20. In this case, an interval between the source line 20 and the stacked gate 50 largely disappears according to a SAS technology characteristic.

FIG. 4 is a sectional view taken along line B-B' in the device isolation region of the semiconductor substrate in FIG. 2. Unlike FIG. 3, which does not include a field region, the device isolation layer 11 in a portion of the substrate 10 where a common source line is formed is removed to form a source line 20.

FIG. 5 is a sectional view taken along line C-C' in the source line 20 of FIG. 2. This illustrates the entire source line 20.

A related art method for manufacturing the source line 20 includes forming a stacked gate, and then performing an ion implantation after etching an oxide layer (i.e., a device isolation layer 11 in a field region of the device) using a photoresist mask. During the etching of the oxide layer, the top portion of the stacked gate 50 may be removed.

Additionally, when an angle is out of range during an ion implantation, a fatal damage may occur in the stacked gate 50, thereby deteriorating reliability of the semiconductor device. When reliability deteriorates in a semiconductor device, operations in manufacturing the semiconductor device may increase in number, and thus the costs of semiconductor manufacturing may increase.

Furthermore, since a common source line is formed along a profile of a trench in a memory cell using a SAS technology, contact resistance of a source in each actual cell may drastically increase. Especially, most memory cells use STI technology as a separation technology when its size is below 0.25 µm or 0.18 µm. The STI technology is necessary to reduce the size of cell in a word line WL direction, and the SAS technology is necessary to reduce the size of cell in a bit line BL direction. When two technologies are applied, a source resistance may drastically increase.

Especially, since the flash memory uses an internal high voltage, as the size of cell decreases and the trench depth deepens, the relative length of the common source line increases. A relatively long source line is disadvantageous for source resistance. In embedded flash memory, programming characteristics and reading speed may deteriorate, thereby adversely affecting product performance over large numbers of devices.

SUMMARY OF THE INVENTION

Accordingly, the present invention is directed to a flash memory and a method for manufacturing the same that substantially obviate one or more problems due to limitations and disadvantages of the related art.

An object of the present invention is to provide a method for manufacturing a flash memory with a more reliable SAS process, and a corresponding flash memory structure.

Another object of the present invention is to provide a flash memory having relatively reduced source line resistance, and a method for manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose of the invention, as embodied and broadly described herein, there is provided a flash memory including: a semiconductor substrate having a device isolation region and an active region; a stacked gate on the semiconductor substrate; an insulation layer covering the semiconductor substrate and the stacked gate; a drain contact penetrating the insulation layer on one side of the stacked gate; and a source line penetrating the insulation layer and an opposite side of the stacked gate.

In another aspect of the present invention, there is provided a method for manufacturing a flash memory, the method including: forming a device isolation region and an active region on a semiconductor substrate; forming a stacked gate on the active region; and forming a drain contact and a source line on opposite sides of the stacked gate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Reference will now be made in detail to the preferred embodiments of the present invention, examples of which are illustrated in the accompanying drawings. It will also be understood that when a layer is referred to as being "on" another layer or substrate, it can be directly on the other layer or substrate, or intervening layers may also be present.

Figure 6:
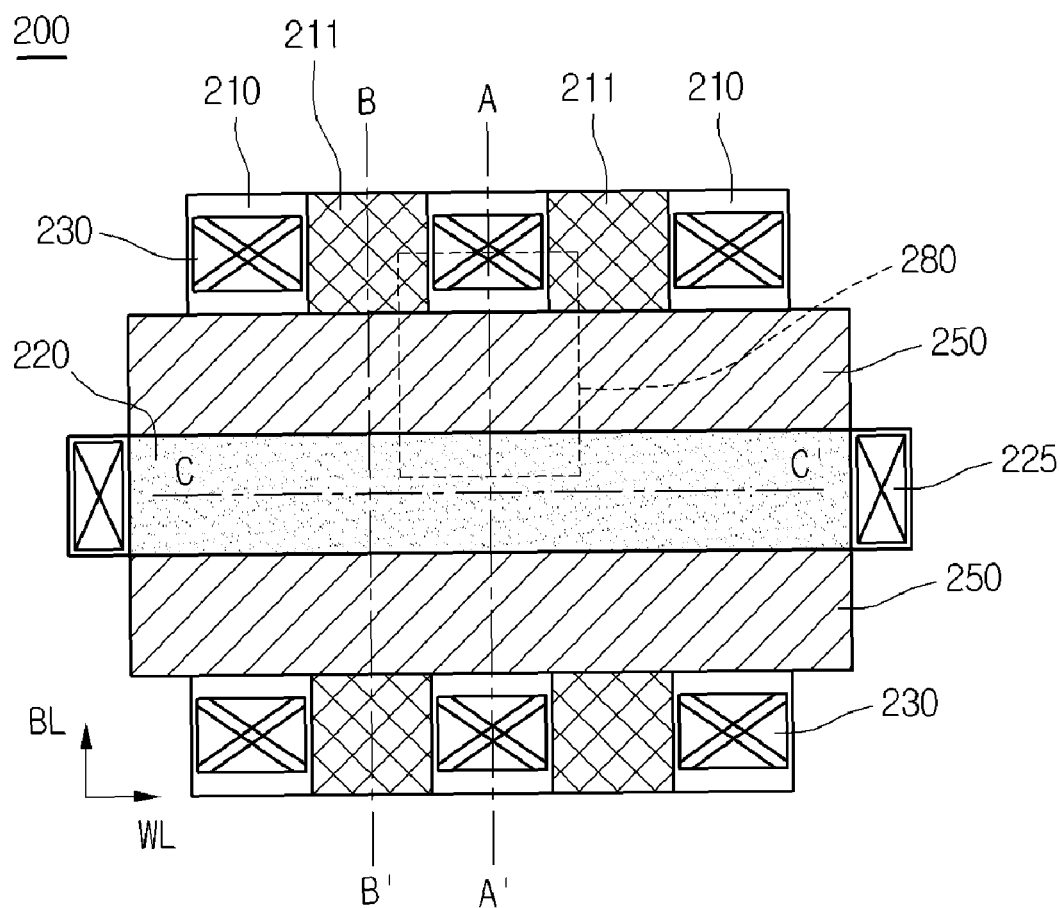
FIG. 6 is a plan view of a flash memory according to an embodiment of the present invention.

FIG. 6 is a plan view of a flash memory 200 according to an embodiment of the present invention.

Referring to FIG. 6, a reference number 250 is a gate line extending in a word line WL direction on a semiconductor substrate 210. A reference number 220 represents a source line. A reference number 225 represents a source line contact. A reference number 230 is a drain contact. A reference number 211 is a device isolation region extending in a bit line BL direction. The device isolation region 211 may comprise a shallow trench isolation (STI) or a LOCOS (LOCal Oxidation of Silicon) field oxide structure. A reference number 280 represents a flash memory unit cell.

Hereinafter, a flash memory including a source line according to an embodiment of the present invention will be described with reference to FIGS. 7 to 9.

Figure 7:
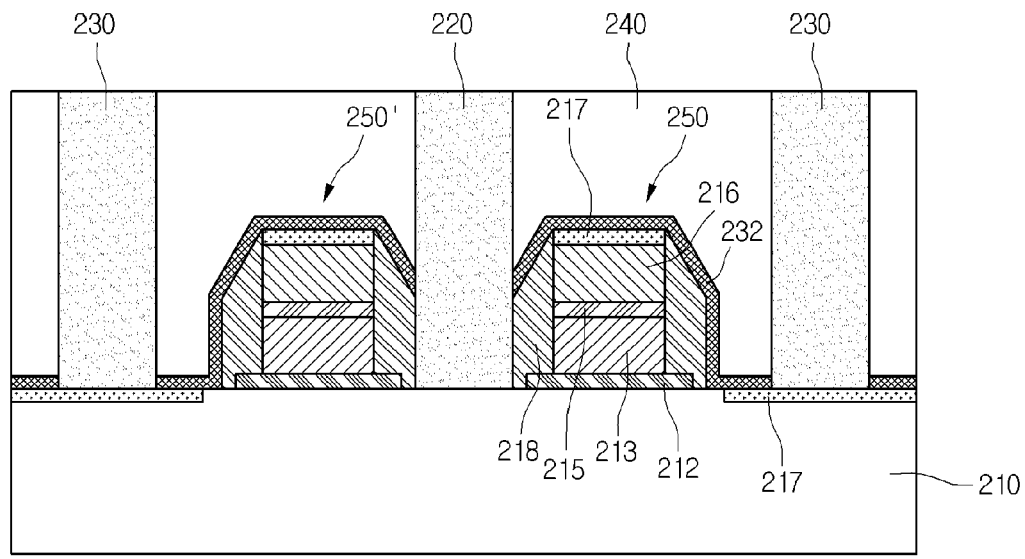
FIGS. 7 to 9 are sectional views of a flash memory according to an embodiment of the present invention.

FIG. 7 is a sectional view taken along line A-A' in an active region of the flash memory in FIG. 6.

The flash memory includes a semiconductor substrate 210 having a device isolation region and an active region, stacked gates 250 and 250' on the semiconductor substrate 210, an interlayer insulation layer 240 covering the semiconductor substrate 210 and the stacked gates 250 and 250', a drain contact 230 penetrating the interlayer insulation layer 240 formed on one side of the stacked gate, and a source line 220 penetrating the interlayer insulation layer 240 formed on the other (opposite) side of the stacked gates 250 and 250'.

Figure 1:
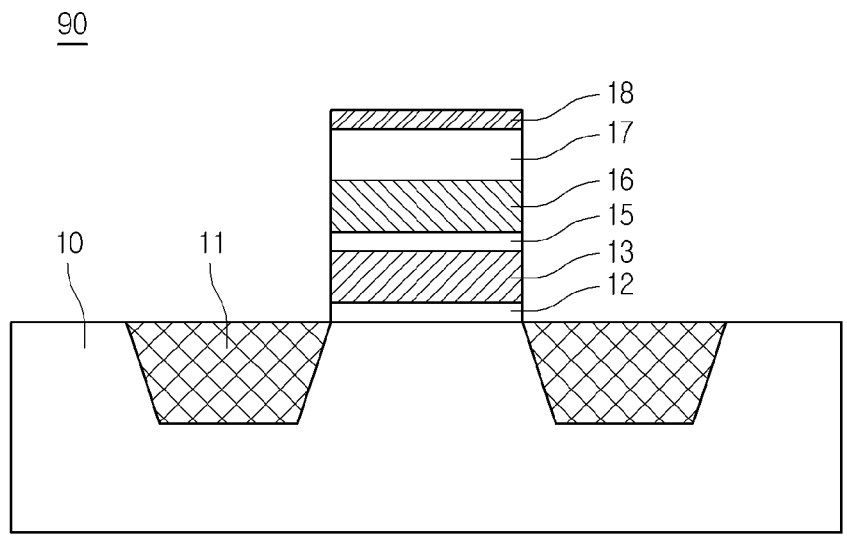
FIG. 1 is a sectional view of a related art flash memory unit cell.
Figure 2:
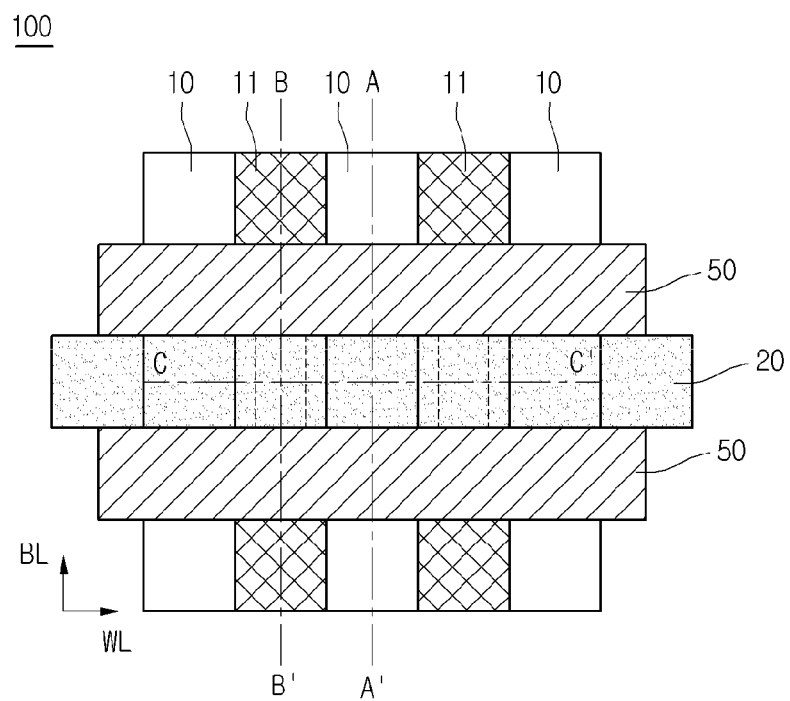
FIG. 2 is a plan view of a related art flash memory.
Figure 3:
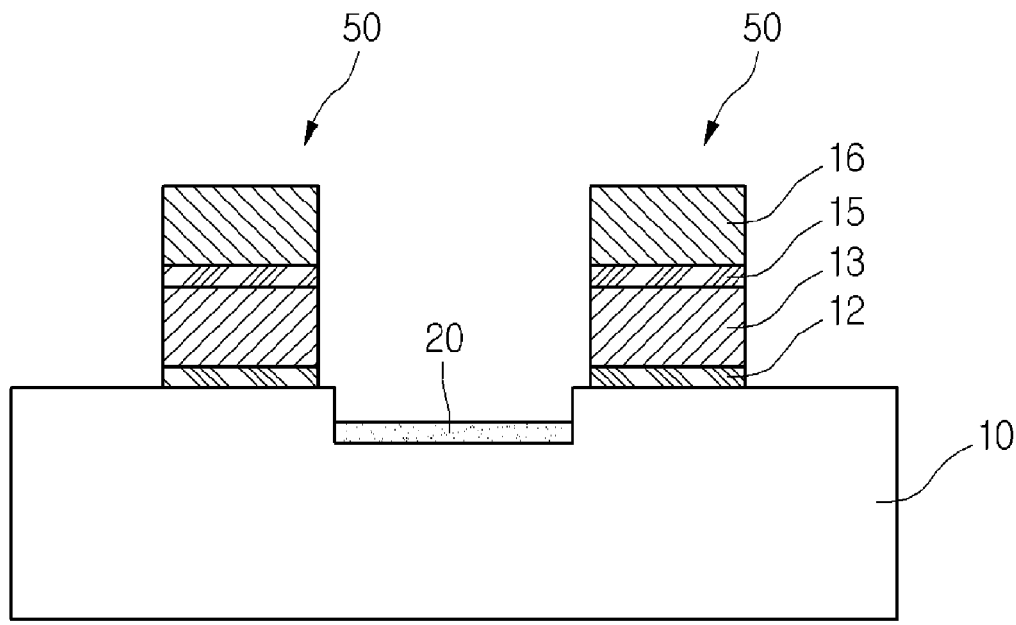
FIGS. 3 to 5 are sectional views of a related art flash memory.

In the flash memory 200, the source line 220 is formed between the stacked gates 250 and 250', and has a column-shaped cross-section, like the gate contact 230 on the semiconductor substrate 210 (but unlike source line 20 in FIG. 3).

First, the stacked gates 250 and 250' include a gate insulation layer 212 formed on the semiconductor substrate, a floating gate 213 formed on a gate insulation layer, a dielectric layer 215 formed on the floating gate 213, and a control gate 216 formed on the dielectric layer 215. The gate insulation layer 212 generally comprises a wet or dry thermally grown silicon oxide layer, and the dielectric layer 215 may include a conventionally deposited or grown oxide or a first oxide layer (not shown) formed on the floating gate 213 (by conventional deposition or thermal growth), a nitride layer (not shown) formed on the first oxide layer, and a second oxide layer (not shown) formed on the nitride layer.

Next, the interlayer insulation layer 240 comprises a dielectric that is used as an insulation layer between conducting wires wired in top and bottom layers in a case of multilayer connections. An insulation layer formed between poly silicon and a first conducting wire may be known as a polysilicon-metal dielectric or a pre-metal dielectric (PMD). A high temperature chemical vapor deposition (CVD)-oxide film, a tetraethyl orthosilicate-(TEOS-)based silicon oxide, or a plasma-enhanced CVD (PECVD) (which may be further enhanced using electron cyclotron resonance [ECR]) oxide can be used as the interlayer insulation layer 240.

Next, the drain contact 230 and the source line 220 can be formed from tungsten because an electric conductivity is important. The tungsten may further include a conventional adhesion layer (e.g., comprising titanium) and/or diffusion barrier layer (e.g., comprising titanium nitride). Alternatively, the drain contact 230 and the source line 220 may comprise electroplated or electrolessly plated copper, on a conventional adhesion layer (e.g., comprising titanium or tantalum), diffusion barrier layer (e.g., comprising titanium nitride or tantalum nitride), and seed layer (comprising sputtered or CVD copper).

Additionally, a flash memory 200 according to another embodiment of the present invention may further include spacer 218 formed on the stacked gate sidewall, and salicide 217 formed on the top surface of the stacked gate and on the substrate on the drain side of the stacked gate. Although not shown in the Figures, the stacked gate transistor further includes source and drain terminals in the substrate, formed by conventional ion implantation. Each source and drain terminal may further include an extension (e.g., a lightly-doped drain, or LDD, extension), also formed by conventional ion implantation.

Additionally, the flash memory 200 further includes a barrier dielectric layer 232 separating the stacked gate and the interlayer insulation layer. The barrier dielectric layer 232 may comprise or consist essentially of a nitride layer.

Figure 8:
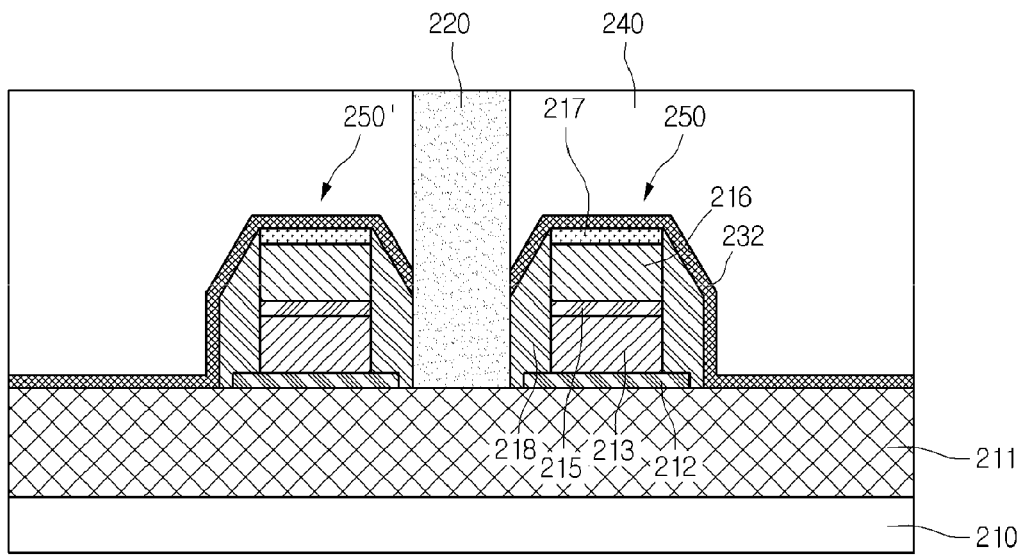

FIG. 8 is a sectional view taken along line B-B' in a device isolation region of a flash memory 200.

Figure 4:
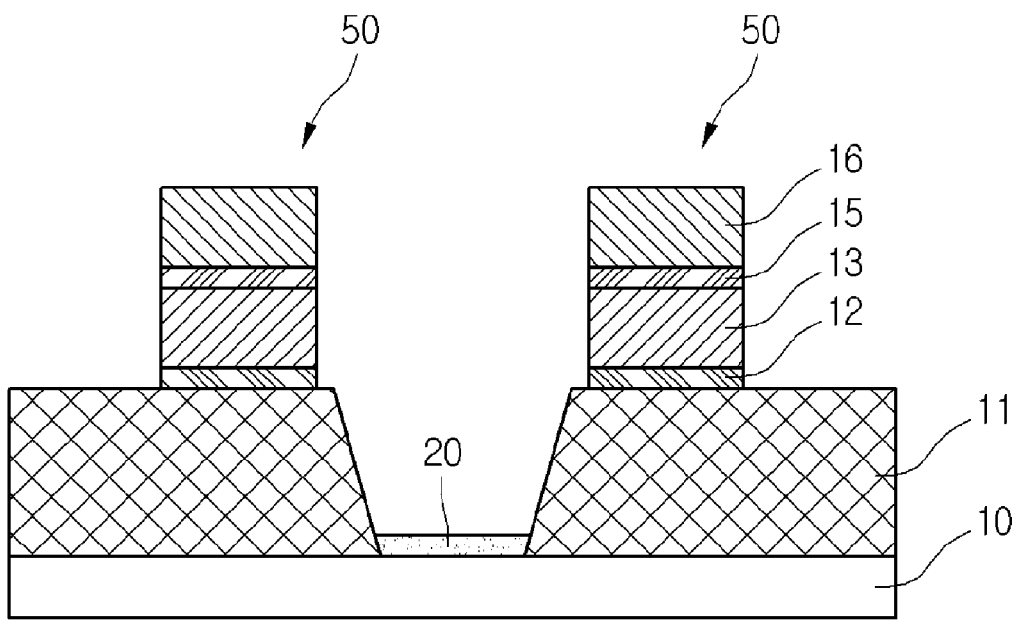

Unlike FIG. 4, the source line 220 is formed between stacked gates 250 and 250' in a sheet shape (but having a column-shaped cross-section) on a device isolation region 211 in the flash memory 200.

Figure 9:
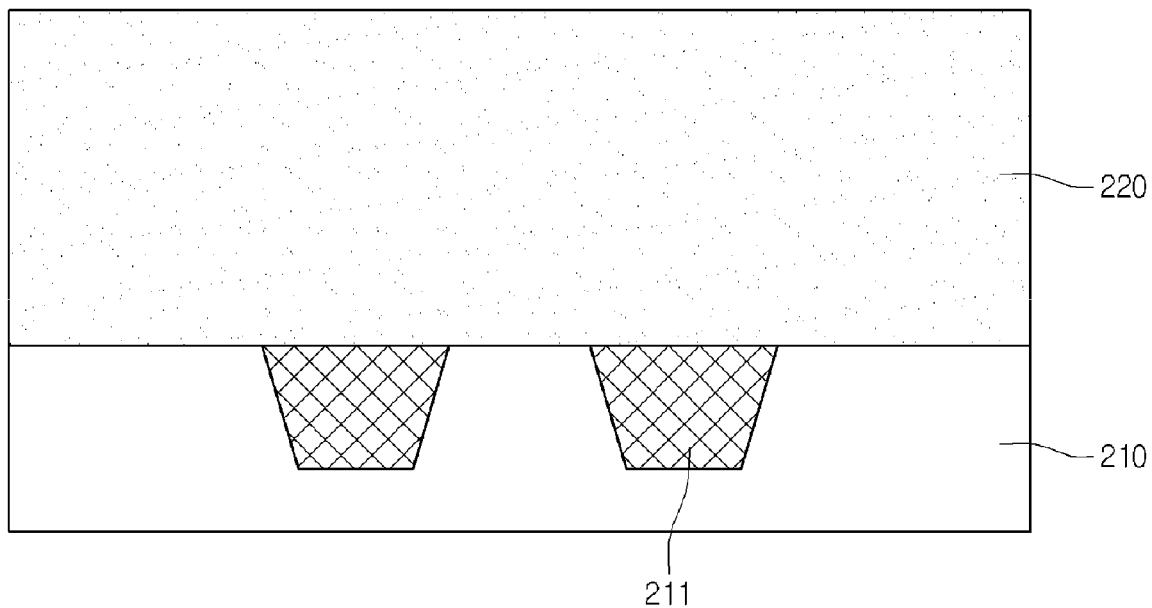

FIG. 9 is a sectional view taken along line C-C' in a source line of a flash memory 200.

Figure 5:
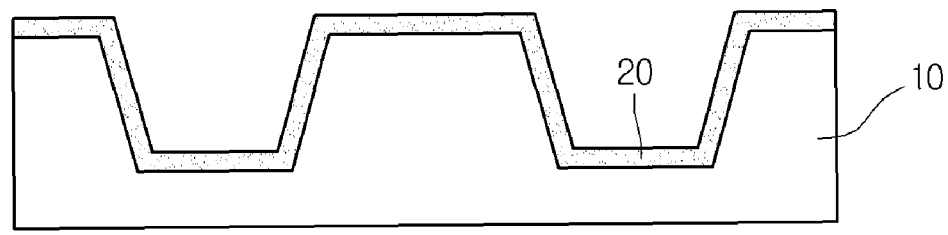

Unlike FIG. 5, the source line 220 is formed on the semiconductor substrate 210 and the device isolation region 211 in the flash memory 200. Since the source line 220 does not follow a trench line, electric conductivity increases. Additionally, electric conductivity increases more by forming the source line 220 from tungsten.

Hereinafter, a method for manufacturing the flash memory 200 will be described with reference to FIGS. 6 and 7.

According to the method, a device isolation region and an active region are formed on a semiconductor substrate. Stacked gates 250 and 250' are formed on the active region. Then, a drain contact 230 and a source line 220 are formed on one side and the other side (e.g., opposite sides) of the stacked gate, respectively.

First, the device isolation region 211 and the active region 210 formed on the semiconductor substrate 210 will be described in more detail.

A STI method is used to divide or define an active region and device isolation region on the semiconductor substrate. In a STI process, a nitride layer may be used as a STI mask with respect to the semiconductor substrate 210 to etch the semiconductor substrate 210 along a bit line direction at a predetermined interval. A nonconductive material such as $SiO_2$ is filled in an etched region by performing a chemical vapor deposition (CVD) process. A planarization process is performed using a chemical mechanical polishing (CMP) planarization process. Then, the device isolation region 211 and the active region 210 are formed by removing the nitride (e.g., mask) layer.

Next, processes of forming the stacked gates 250 and 250' will be described.

First, a gate insulation layer 212 is formed on a semiconductor substrate 210. The gate insulation layer 212 of the flash memory is called a tunnel oxide layer because electrons can travel inside the gate insulation layer 212 by a phenomenon known as tunneling. Next, silicon is deposited on the gate insulation layer 212 (which may be converted to polycrystalline silicon by subsequent annealing), and then etched using a mask to form a floating gate 213. Next, an oxide layer, and optionally a nitride layer and another oxide layer, is/are sequentially formed on the floating gate 213 to form an oxide or oxide-nitride-oxide (ONO) dielectric layer 215. Next, a second silicon layer is deposited on the dielectric layer 215 (which may also be converted to polycrystalline silicon by subsequent annealing), and then etched using a mask to form a control gate 216. In this process, the control gate 216 may have a greater width than the floating gate 213. Alternatively, the layers for the entire stacked gate structure can be formed in sequence, then patterned and etched in a single photolithographic (mask) step to form stacked gates 250 and 250'. If desired, LDD regions can be formed in the substrate 210 by ion implantation. Spacer(s) 218 can be formed conventionally by insulator deposition (e.g., of one or more insulator layers such as silicon oxide, silicon nitride, etc.) and anisotropic etching. Source and drain terminals are then generally formed by ion implantation.

Next, processes of forming a metal contact and a source line will be described.

First, an interlayer insulation layer 240 is formed to cover the semiconductor substrate 210 and the stacked gates 250 and 250'. A high temperature CVD-oxide film, tetraethyl orthosilicate, electron cyclotron resonance (ECR)-plasma-enhanced CVD (PECVD) can be used to form the interlayer insulation layer 240 as described above. Next, an etching process is performed to form a hole for the drain contact 230 and an opening for the source line 220 using a mask. The drain contact 230 and the source line 220 are simultaneously formed by performing a CVD process on the etched hole and opening. At this point, the drain contact 230 and the source line 220 may comprise tungsten, having an excellent electric conductivity.

At this point, a method for manufacturing a flash memory 200 according to another embodiment of the present invention further may include forming a barrier dielectric layer 232 covering the semiconductor substrate 210 and the stacked gates 250 and 250' before forming the interlayer insulation layer 240 covering the semiconductor substrate 210 and the stacked gates 250 and 250' during the forming of the metal contact and the source line. In this case, the barrier dielectric layer 232 may comprise a nitride layer.

Additionally, a method for manufacturing a flash memory 200 according to further another embodiment of the present invention further includes forming salicide 217 on the top surface of the stacked gates 250 and 250', and on the drain side of the stacked gates 250 and 250', after forming the stacked gates 250 and 250'. In forming the salicide 217, an insulation layer for sidewall spacer(s) 218 is deposited on the stacked gates 250 and 250', and is anisotropically etched (or, alternatively, using a mask) to form spacer(s) 218. Next, a metal layer is deposited on the stacked gates 250 and 250', the spacer 218, and the semiconductor substrate 210, and is heated or annealed. Next, remaining (unreacted) metal is removed. The metal layer may comprise cobalt, nickel, molybdenum, or titanium.

Alternatively, a silicide (not shown) process can be performed without forming the spacer 218. In the silicide process, a metal is applied to the surface of the semiconductor substrate 210, and then is heated for reaction to reduce contact resistance components of the source and the drain contact.

On the other hand, the salicide 217 is a self aligned silicide. Additionally, electrical connections that may otherwise form between the gate, the source, and the drain are blocked during the salicide process by the sidewall spacer structure that forms a perimeter around the sides of the gate. At this point, since the sidewall spacer 218 is effectively used as a mask, without use of an additional (photolithographically defined) mask, it may be considered to be a salicide.

As described above, in the present flash memory and method for manufacturing the same, by simultaneously forming a drain contact pattern and defining a source line pattern for a source line manufacturing process, the drain contact and the source line may be formed simultaneously, thereby omitting a separate self aligned source (SAS) process for forming a source line in the flash memory substrate by photolithography and ion implantation. Consequently, process operations and manufacturing cost can be minimized. Additionally, reliability can be achieved by increasing the reliability of the SAS and process for forming the same. Moreover, the size of a semiconductor device can be further reduced by adjusting the width of the source line.

Additionally, since the source line of the flash memory does not follow a trench line, electric conductivity increases. Also, since the source line may comprise a metal such as tungsten, the resistance of the source line may further decrease.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A flash memory comprising:
    a semiconductor substrate including a device isolation region and an active region;
    a stack gate on the active region, the stack gate comprising a gate insulation layer formed on the semiconductor substrate, a floating gate formed on the gate insulation layer, a dielectric layer formed on the floating gate, and a control gate formed on the dielectric layer;
    a drain terminal on one side of the stack gate;
    a source terminal on an opposite side of the stack gate;
    an insulation layer covering the semiconductor substrate and the stack gate;
    a drain contact penetrating the insulation layer on the one side of the stack gate, the drain contact making electrical contact with only the drain terminal;
    a source line penetrating the insulation layer on the opposite side of the stack gate, the source line interconnecting source terminals of adjacent stack gates; and
    a source line contact on the source line, wherein the drain contact and the source line consist essentially of identical materials.

2. The flash memory according to claim 1, further comprising a silicide formed on a top and on the drain terminal.

3. The flash memory according to claim 1, further comprising:
    a spacer on a sidewall of the stack gate; and
    a salicide on a top and on the drain terminal.

4. The flash memory according to claim 1, further comprising a barrier dielectric layer separating the stack gate and the insulation layer.

5. The flash memory according to claim 4, wherein the barrier dielectric layer comprises a nitride layer.

6. The flash memory according to claim 1, wherein the source line contacts one of the plurality of device isolation regions between adjacent active regions.

7. The flash memory according to claim 6, wherein the source line is formed on the semiconductor substrate and the device isolation region.

8. The flash memory according to claim 6, wherein the source line extends to a top surface of the insulation layer.

9. A flash memory comprising:
    a semiconductor substrate including a plurality of device isolation regions and a plurality of active regions;
    a plurality of stack gates on each of the plurality of active regions, each of the plurality of stack gates comprising a gate insulation layer on the semiconductor substrate, a floating gate on the gate insulation layer, a dielectric layer on the floating gate, and a control gate on the dielectric layer;
    a drain terminal on one side of each of the plurality of stack gates in each of the active regions;
    a common source terminal between adjacent ones of the plurality of stack gates;
    an insulation layer covering the semiconductor substrate and each of the plurality of stack gates;
    a plurality of drain contacts penetrating the insulation layer on the one side of each of the plurality of stack gates, each of the plurality of drain contacts making electrical contact with only one of the plurality of drain terminals;
    a source line penetrating the insulation layer between said adjacent ones of the plurality of stack gates, the source line interconnecting the common source terminals in adjacent active regions; and
    a source line contact on the source line, wherein each of the plurality of drain contacts and the source line consist essentially of identical materials.

10. The flash memory according to claim 9, further comprising a silicide on a top of each of the plurality of stack gates and on each of the drain terminals.

11. The flash memory according to claim 9, further comprising:
    a spacer on a sidewall of each of the plurality of stack gates; and
    a salicide on a top of each of the plurality of stack gates and on each of the drain terminals.

12. The flash memory according to claim 9, further comprising a barrier dielectric layer separating the plurality of stack gates and the insulation layer.

13. The flash memory according to claim 12, wherein the barrier dielectric layer comprises a nitride layer.

14. The flash memory according to claim 9, wherein the source line contacts one of the plurality of device isolation regions between the adjacent active regions.

15. The flash memory according to claim 14, wherein the source line extends to a top surface of the insulation layer.

16. The flash memory of claim 13, wherein the insulation layer comprises a silicon oxide layer.

17. The flash memory of claim 1, wherein the drain contact and the source line comprise tungsten.

18. The flash memory of claim 17, wherein the drain contact and the source line further comprise an adhesion layer and/or diffusion barrier layer.

19. The flash memory of claim 9, wherein each of the plurality of drain contacts and the source line comprise tungsten.

20. The flash memory of claim 19, wherein each of the plurality of drain contacts and the source line further comprise an adhesion layer and/or diffusion barrier layer.

* * * * *